United States Patent
Hassan et al.

(10) Patent No.: US 9,321,676 B2
(45) Date of Patent: *Apr. 26, 2016

(54) LOW-E GLAZING PERFORMANCE BY SEED STRUCTURE OPTIMIZATION

(71) Applicants: Intermolecular Inc., San Jose, CA (US); Guardian Industries Corp., Auburn Hills, MI (US)

(72) Inventors: Mohd Fadzli Anwar Hassan, San Francisco, CA (US); Brent Boyce, Novi, MI (US); Guowen Ding, San Jose, CA (US); Muhammad Imran, Brownstown, MI (US); Minh Huu Le, San Jose, CA (US); Zhi-Wen Wen Sun, Sunnyvale, CA (US); Yu Wang, San Jose, CA (US); Yongli Xu, Plymouth, MI (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/702,284

(22) Filed: May 1, 2015

(65) Prior Publication Data

US 2015/0232376 A1 Aug. 20, 2015

Related U.S. Application Data

(63) Continuation of application No. 13/797,412, filed on Mar. 12, 2013, now Pat. No. 9,052,456.

(51) Int. Cl.
*B32B 15/04* (2006.01)
*B32B 17/06* (2006.01)
*C03C 17/23* (2006.01)

(52) U.S. Cl.
CPC ............ *C03C 17/23* (2013.01); *C03C 2217/211* (2013.01); *C03C 2217/24* (2013.01); *Y10T 428/265* (2015.01)

(58) Field of Classification Search
USPC .......... 428/426, 428, 432, 434, 688, 689, 697, 428/699, 701, 702
See application file for complete search history.

(56) References Cited

U.S. PATENT DOCUMENTS

| | | | | |
|---|---|---|---|---|
| 5,591,529 A | * | 1/1997 | Braatz | G02B 5/208 359/359 |
| 6,596,398 B1 | * | 7/2003 | Russo | C03C 17/2453 428/426 |
| 2009/0011194 A1 | * | 1/2009 | Nadaud | C03C 17/3417 428/174 |
| 2009/0214880 A1 | * | 8/2009 | Lemmer | B32B 17/10036 428/432 |
| 2011/0094577 A1 | * | 4/2011 | Chatterjee | C03C 17/253 136/256 |
| 2012/0064335 A1 | * | 3/2012 | Jun | C03C 17/366 428/336 |

\* cited by examiner

Primary Examiner — Lauren R Colgan (57) ABSTRACT

A bi-layer seed layer can exhibit good seed property for an infrared reflective layer, together with improved thermal stability. The bi-layer seed layer can include a thin zinc oxide layer having a desired crystallographic orientation for a silver infrared reflective layer disposed on a bottom layer having a desired thermal stability. The thermal stable layer can include aluminum, magnesium, or bismuth doped tin oxide (AlSnO, MgSnO, or BiSnO), which can have better thermal stability than zinc oxide but poorer lattice matching for serving as a seed layer template for silver (111).

10 Claims, 5 Drawing Sheets

LOW-E GLAZING PERFORMANCE BY SEED STRUCTURE OPTIMIZATION

CROSS-REFERENCE TO RELATED APPLICATIONS

This is a Continuation application of U.S. patent application Ser. No. 13/797,412, filed on Mar. 12, 2013, which is herein incorporated by reference for all purposes.

The present application is related to U.S. patent application Ser. No. 13/305,550, filed Nov. 28, 2011, and to U.S. patent application Ser. No. 13/337,962, filed Dec. 27, 2011, each of which is hereby incorporated by reference for all purposes.

TECHNICAL FIELD

The present invention relates to low emissivity panels, and more particularly to low-e panels having a bi-layer seed layer for a silver infrared reflective layer and methods for forming such low-e panels.

BACKGROUND OF THE INVENTION

Sunlight control glasses are commonly used in applications such as building glass windows and vehicle windows, typically offering high visible transmission and low emissivity. High visible transmission can allow more sunlight to pass through the glass windows, thus being desirable in many window applications. Low emissivity can block infrared (IR) radiation to reduce undesirable interior heating.

In low emissivity glasses, IR radiation is mostly reflected with minimum absorption and emission, thus reducing the heat transferred to and from the low emissivity surface. Typical sunlight control glasses generally have an emissivity of about 0.1 and a light transmission of about 80%. High transmittance, low emissivity glasses generally include a reflective metal film (e.g., silver) to provide infrared reflectance and low emissivity, along with various dielectric layers, such as tin oxide or zinc oxide, to provide a barrier to prevent oxidation or corrosion, as well as to act as optical fillers and function as anti-reflective coating layers to improve the optical characteristics of the glass panel.

In certain cases, the glasses are heat treated for tempering, bending or strengthening, requiring the use of temperatures of 500 C or higher. The heat treatment process can affect the coatings, such as deterioration, structural or color changes, or become hazy following the heat treatment, exhibiting a reduction in visible transmission and significant color changes.

SUMMARY

Low emissivity panels often utilize a silver layer to reflect infrared, with the silver layer having (111) crystallographic orientation for best infrared reflection properties. A zinc oxide seed layer having (002) crystallographic orientation can be used to provide a template to promote the deposition of (111) silver layer. However, thick layers of zinc oxide can show thermal instability behavior, e.g., changing optical and mechanical properties after exposure to high temperature processes.

In some embodiments, a bi-layer is provided having seed layer property together with high thermal stability during high temperature fabrication processes. In some embodiments, the bi-layer can decouple the crystallographic orientation and thermal stability. The bi-layer can include a thin top layer having a desired crystallographic orientation on a bottom layer having a desired thermal stability. The thinner layer can exhibit better thermal stability, and the bottom layer can compensate for the desired total thickness with better thermal stability behavior.

In some embodiments, provided is a bi-layer seed structure for an infrared reflective layer to be used in low emissivity coatings. The bi-layer seed structure can include a thin zinc oxide layer disposed on a thermally stable layer. The thin zinc oxide seed layer can be between 2 nm to 4 nm to offer good seed properties for the infrared reflective layer, together with improved thermal stability. The thermally stable layer can be an alloy of zinc oxide or tin oxide, e.g., doped zinc oxide or doped tin oxide, which can satisfy the thickness requirement of the seed layer, while contributing to the thermal stability of the seed layer. For example, the thermally stable layer can include aluminum, magnesium, or bismuth doped tin oxide (AlSnO, MgSnO, or BiSnO), which can have better thermal stability than zinc oxide but poor lattice matching for serving as a seed layer template for silver (111). The alloy of zinc oxide or tin oxide can prepare the surface so that a thin zinc oxide deposited thereon can achieve a good seed layer orientation.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

A conductive layer can exhibit infrared reflectance behavior, with the percentage of reflectance proportional to the conductivity. Metals are typically used as infrared reflective layers, with silver offering between 95-99% and gold 98-99% reflectivity in the infrared region. The percentage difference of a material can depend on its crystallographic orientation, for example, silver having (111) crystallographic orientation can be shown to exhibit the best infrared reflectivity.

To promote a desired crystallographic orientation of a deposited material, a seed layer can be used to provide a template, since under proper conditions, a material deposited on a seed layer will have similar crystallographic orientation as the seed layer. For example, to promote deposition of a (111) silver layer, zinc oxide having (002) crystallographic orientation can be used as a seed layer.

In some embodiments, methods and materials for transparent and low emissive coatings are provided with improved thermal stability. The coated panels sometimes are desired to be heat treated, e.g., to toughen the glass substrate or to ease bending in various areas of applications. The substrates are typically heated to a temperature near or above the softening point and then toughened by rapid cooling or bending them to appropriate shapes. For example, tempered glass can be stronger than annealed glass, and can shatter into small pieces when broken. The temperature range for glass heat treatment can be less than 1000 C, such as between 500 and 900 C, with a processing time of several minutes, e.g., between 5 to 10 minutes.

In some embodiments, a heat treatable dielectric coating, and corresponding coating stacks, are provided, which are thermally stable with minimal changes before and after a heat treatment, so that non-heat treated and heat treated substrates can be stocked interchangeably. The heat treatment does not cause a significant change in the coating optical and structural properties, including reflective and transmittive optical properties, such as visible transmission, IR reflectance, microscopic morphological properties, color appearance, and haze characteristics. For example, the coated transparent panels have reduced changes in appearance upon a heat treatment, such as a color difference that can be detected by visual inspection.

Heat treatments of coated glass panels can generate complications, such as changes in structural properties and color between non-heat treated and heat treated products, for example, upon heating of the coated glass, a color change can be observed, making the as-coated product and heat treated (tempered) product different in appearance.

In some embodiments, the present composition allows a single product, in terms of minimal or no color change between as-coated and tempered glasses, avoiding the need for different stack designs used to match the color between as-coated and heat treated products. The present composition can be used in thin film coatings for transparent substrates.

In some embodiments, methods, and coatings produced from the methods, are provided to decouple seed layer properties and thermal stability properties for a seed structure for an infrared reflective layer to be used in low emissivity coatings. The decoupling can allow better selection of materials and process conditions for the seed structure, for example, by selecting a first material that can provide good seed behavior and a second material that can provide good thermal stability. The methods can include forming a thin top layer having a desired crystallographic orientation on a bottom layer having a desired thermal stability. The thinner layer can exhibit better thermal stability, and thus the thin top layer, though including materials having poorer thermal stability than the bottom layer, can achieve good thermal stability due to the reduced thickness. The bottom layer can compensate for the desired total thickness with better thermal stability behavior.

In some embodiments, the methods can include a bi-layer seed structure including a top layer having good seed properties and a bottom layer having good thermal stability properties. The top layer can function as a template for forming a conductive layer with a desired crystallographic orientation, for example, to optimize the infrared reflective property. The bottom layer can withstand high temperature processes, allowing minimal or no changes, for example, in structural or optical behaviors during baking or tempering. The top seed layer can be a thin ZnO layer, for example, much thinner than a conventional ZnO seed layer for silver infrared reflective layer. The thin ZnO seed layer can exhibit minimal or no thermal degradation, allowing the infrared reflective coatings to have more stable structure and the same visual appearance, e.g., less color changes, of low emissivity products between as-coated products and heat tempered products.

The thin zinc oxide seed layer can be equal to or less than about 12 nm, for example, less than about 8 nm, or between 2 and 4 nm, to offer good seed properties for the infrared reflective layer, together with improved thermal stability, e.g., exhibiting minimal structural changes during high temperature processes. The thin zinc oxide seed layer can also be non-continuous.

The thermally stable layer can satisfy the thickness requirement of the seed layer, while contributing to the thermal stability of the seed layer. For example, the thermally stable layer can be a layer, such as an alloy of zinc oxide or tin oxide, e.g., doped zinc oxide or doped tin oxide, which can have better thermal stability than zinc oxide but poor lattice matching for serving as a seed layer template for silver (111). The thermally stable layer can include aluminum, magnesium, or bismuth doped tin oxide (AlSnO, MgSnO, or BiSnO), which can have better thermal stability than zinc oxide but poor lattice matching for serving as a seed layer template for silver (111). The alloy of zinc oxide or tin oxide can prepare the surface so that a thin zinc oxide deposited thereon can achieve a good seed layer orientation.

In some embodiments, the doped tin oxide layer can include tin, oxygen and aluminum, magnesium, or bismuth with higher than 2.5% by weight, such as higher than 15% by weight of the total metal weight. The doped tin oxide can offer improved thermal stability over tin oxide and other dielectric materials with respect to appearance and optical properties after high temperature processes, including reflective and transmittive optical properties. For example, upon a heat treatment at a temperature higher than 500 C, changes in color and index of refraction of the present transparent dielectric composition are noticeably less than those of tin oxide films of comparable thickness. Further, the doped tin oxide can exhibit minimum structural changes, including possessing an amorphous structure that is stable upon the high temperature process. In some embodiments, the doped tin oxide can include less than 70% by weight of aluminum, magnesium, or bismuth with respect to the total metal weight in the composite film, such as less than 35% by weight.

The doped tin oxide can be an oxide alloy of tin with magnesium, aluminum, or bismuth. The mixture can have different forms on the microscopic level, and in the context of the invention, comprising atoms of tin, oxygen and magnesium, aluminum, or bismuth, regardless of how they are bound to each other on the microscopic level. In some embodiments, the mixture of tin oxide with magnesium, aluminum, or bismuth is suitable for a transparent compound layer with thermal stability properties, in addition to having high light transmittance and low thermal energy transmittance. The doped tin oxide can show improved overall properties after a heat treatment, compared to pure tin oxide, including a stable structure, as determined by x-ray diffraction (XRD) spectra before and after the heat treatment, and smaller changes in optical properties as compared to tin oxide.

In some embodiments, materials, thin films, and processes that provide the coated panels with similar or same structures and appearance for as-coated and tempered products are provided. The coatings can be subjected to prolonged high temperature heat treatments without damaging the coated panels, with minimal property changes, such as light transmittance, IR reflection, structure, and color appearance. In addition, the coatings can protect the IR reflecting layers during high temperature processes, such as preventing oxidation or agglomeration of the IR reflective layer.

Generally, it is preferable to form the infrared reflective layer in such a way that visible light transmission is high and emissivity is low. For example, with an infrared reflective layer including silver, it is preferable for the silver layer to have (111) crystallographic orientation because it allows for the silver layer to have relatively high electrical conductivity, and thus relatively low sheet resistance (Rs) at thin layer thickness. Thin layer thickness is desirable to provide high visible light transmission, and low sheet resistance is preferred low sheet resistance can offer low infrared emissivity.

To promote the crystal orientation of the infrared reflective layer, a seed layer can be used. Generally, seed layers are relatively thin layers of materials formed on a surface (e.g., a substrate) to promote a particular characteristic of a subsequent layer formed over the surface (e.g., on the seed layer). For example, seed layers may be used to improve adhesion between the subsequent layer and the substrate or increase the rate at which the subsequent layer is grown on the substrate during the respective deposition process.

A seed layer can also affect the crystalline structure (or crystallographic orientation) of the subsequent layer, which is sometimes referred to as "templating." For example, the interaction of the material of the subsequent layer with the crystalline structure of the seed layer causes the crystalline structure of the subsequent layer to be formed in a particular orientation.

For example, a seed layer can be used to promote growth of the infrared reflective layer in a particular crystallographic orientation. For example, a seed layer can comprise a material with a hexagonal crystal structure and can be formed with a (002) crystallographic orientation (such as zinc oxide or doped zinc oxide), which promotes growth of a silver layer in the (111) orientation when the silver layer has a face centered cubic crystal. Thus the seed layer can improve the conductivity of the deposited silver layer such that the thickness of the silver layer may be reduced while still providing the desirably low emissivity. In some embodiments, the formation of a high conductivity and thin silver layer can be achieved by forming a relatively thin (e.g., up to about 5 nm) seed layer of, for example, zinc oxide or doped zinc oxide on the substrate, before depositing the silver layer.

In some embodiments, the crystallographic orientation can be characterized by X-ray diffraction (XRD) technique, which is based on observing the scattered intensity of an X-ray beam hitting the layer, e.g., silver layer or seed layer, as a function of the X-ray characteristics, such as the incident and scattered angles. For example, zinc oxide seed layer can show a pronounced (002) peak and higher orders in a $\theta$-$2\theta$ diffraction pattern. This suggests that zinc oxide crystallites with the respective planes oriented parallel to the substrate surface are present.

In some embodiments, the terms "silver layer having (111) crystallography orientation", or "zinc oxide seed layer having (002) crystallography orientation" comprise a meaning that there is a (111) preferred crystallographic orientation for the silver layer or a (002) preferred crystallographic orientation for the zinc oxide seed layer, respectively. The preferred crystallographic orientation can be determined, for example, by observing pronounced crystallography peaks in an XRD characterization.

In some embodiments, the present invention discloses methods, and coated panels formed for the methods, to improve a zinc oxide containing seed layer, which in turn, can improve an infrared reflective layer, e.g., a silver layer. In some embodiments, the present invention discloses methods to form zinc oxide or doped zinc oxide layers having large grain sizes with preferred crystal orientation. For example, (002) oriented zinc oxide or doped zinc oxide layers can be formed on glass substrates to enhance the conductivity of a subsequently deposited silver layer.

Figure 1A:
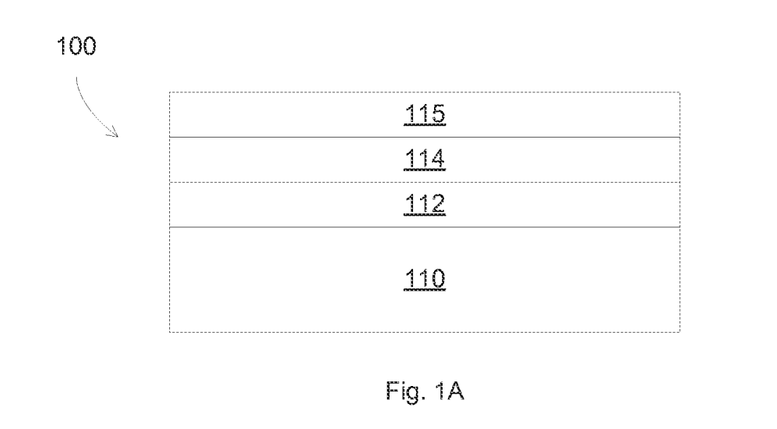
FIG. 1A illustrates an exemplary thin film coating according to some embodiments.

FIG. 1A illustrates an exemplary thin film coating according to some embodiments. An infrared reflective layer, such as a silver layer 115, is disposed on a thin seed layer, such as a zinc oxide or a doped zinc oxide layer 114, which is disposed on a thermally stable layer 112 on a substrate 110 to form a coated transparent panel 100, which has high visible light transmission, and low IR emission. The thermally stable layer 114 can be a layer, such as tin oxide doped with aluminum, magnesium, or bismuth. The thermally stable layer also can have a crystal orientation to promote a crystal orientation of the seed layer 112. The seed layer 112 can include materials and/or crystal orientation to promote a crystal orientation of the infrared reflective silver 115. In combination with the thermally stable layer, the seed layer 112 can be thin, e.g., thinner than without the thermally stable layer, and still can promote the crystal orientation of the silver layer.

The layers 112, 114, and/or 115 can be sputtered deposited using different processes and equipment, for example, the targets can be sputtered under direct current (DC), pulsed DC, alternate current (AC), radio frequency (RF) or any other suitable conditions. In some embodiments, the present invention discloses a physical vapor deposition method for depositing the layers 112, 114, and/or 115. The deposition process can comprise a gas mixture introduced to a plasma ambient to sputter material from one or more targets disposed in the processing chamber. The sputtering process can further comprise other components such as magnets for confining the plasma, and utilize different process conditions such as DC, AC, RF, or pulse sputtering.

In some embodiments, the present invention discloses a coating stack, comprising multiple layers for different functional purposes. For example, the coating stack can comprise a ZnO seed layer to facilitate the deposition of the reflective layer, a thermally stable layer to facilitate the deposition of the seed layer, an oxygen diffusion barrier layer disposed on the reflective layer to prevent oxidation of the reflective layer, a protective layer disposed on the substrate to prevent physical or chemical abrasion, or an antireflective layer to reduce visible light reflection. The coating stack can include multiple layers of reflective layers to improve IR emissivity.

Figure 1B:
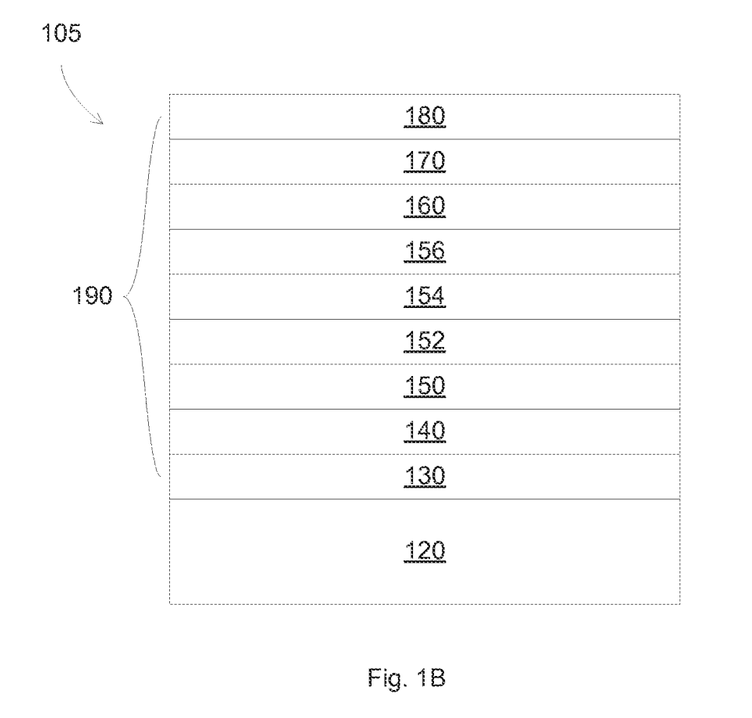
FIG. 1B illustrates a low emissivity transparent panel 105 according to some embodiments.

FIG. 1B illustrates a low emissivity transparent panel 105 according to some embodiments. The low emissivity transparent panel can include a glass substrate 120 and a low-e stack 190 formed over the glass substrate 120. The glass substrate 120, in some embodiments, is made of a glass, such as borosilicate glass, and has a thickness of, for example, between 1 and 10 millimeters (mm). The substrate 120 may be square or rectangular and about 0.5-2 meters (m) across. In some embodiments, the substrate 120 may be made of, for example, plastic or polycarbonate.

The low-e stack 190 includes a lower protective layer 130, a lower oxide layer 140, a thermally stable layer 150, a seed layer 152, a reflective layer 154, a barrier layer 156, an upper oxide 160, an optical filler layer 170, and an upper protective layer 180. Some layers can be optional, and other layers can be added, such as interface layer or adhesion layer. Exemplary details as to the functionality provided by each of the layers 130-180 are provided below.

The various layers in the low-e stack 190 may be formed sequentially (i.e., from bottom to top) on the glass substrate 120 using a physical vapor deposition (PVD) and/or reactive (or plasma enhanced) sputtering processing tool. In some embodiments, the low-e stack 190 is formed over the entire glass substrate 120. However, in some embodiments, the low-e stack 190 may only be formed on isolated portions of the glass substrate 120.

The lower protective layer 130 is formed on the upper surface of the glass substrate 120. The lower protective layer 130 can include silicon nitride, silicon oxynitride, or other nitride material such as SiZrN, for example, to protect the other layers in the stack 190 from diffusion from the substrate 120 or to improve the haze reduction properties. In some embodiments, the lower protective layer 130 is made of silicon nitride and has a thickness of, for example, between about 10 nm to 50 nm, such as 25 nm.

The lower oxide layer 140 is formed on the lower protective layer 130 and over the glass substrate 120. The lower oxide layer 140 can be a metal oxide or metal alloy oxide layer and can serve as an antireflective layer.

The seed layer 152 can be used to provide a seed layer for the IR reflective film, for example, a zinc oxide layer deposited before the deposition of a silver reflective layer can provide a silver layer with lower resistivity, which can improve its reflective characteristics. The seed layer can include zinc oxide.

In some embodiments, the seed layer 152 can be continuous and covers the entire substrate. For example, the thickness of the second seed layer can be less than about 10 nm, such as less than about 5 nm. Alternatively, the seed layer 152 may not be formed in a completely continuous manner. The seed layer can be distributed across the substrate surface such that each of the seed layer areas is laterally spaced apart from the other seed layer areas across the substrate surface and do not completely cover the substrate surface. For example, the thickness of the seed layer 152 can be a monolayer or less, such as between 2.0 and 4.0 Å, and the separation between the layer sections may be the result of forming such a thin seed layer (i.e., such a thin layer may not form a continuous layer).

The reflective layer 154 is formed on the second seed layer 152. The IR reflective layer can be a metallic, reflective film, such as gold, copper, or silver. In general, the IR reflective film includes a good electrical conductor, blocking the passage of thermal energy. In some embodiments, the reflective layer 154 is made of silver and has a thickness of, for example, 10 nm. Because the reflective layer 154 is formed on the seed layer 152, for example, due to the (002) crystallographic orientation of the second seed layer 152, growth of the silver reflective layer 154 in a (111) crystalline orientation is promoted, which offers low sheet resistance, leading to low panel emissivity.

Because of the promoted (111) texturing orientation of the reflective layer 154 caused by the seed layer 152, the conductivity and emissivity of the reflective layer 154 is improved. As a result, a thinner reflective layer 154 may be formed that still provides sufficient reflective properties and visible light transmission. Additionally, the reduced thickness of the reflective layer 154 allows for less material to be used in each panel that is manufactured, thus improving manufacturing throughput and efficiency, increasing the usable life of the target (e.g., silver) used to form the reflective layer 154, and reducing overall manufacturing costs.

In some embodiments, a thermally stable layer 150 is provided to help improving the thermal stability of the coated layers, and optionally serving as a seed layer for the ZnO seed layer 152. The thermally stable layer 150 can further improve the ZnO film crystallinity and the preferred crystal orientation for the (002) basal plane to optimize the optical and electrical properties of the ZnO seed layer 152. In some embodiments, methods to improve the seed layer for the infrared reflective layer are disclosed by providing a nucleation layer, e.g. a thermally stable layer to promote the film crystallinity and the crystal orientation of the seed layer.

In some embodiments, the thermally stable layer can have similar characteristics as those of the seed layer. For example, the thermally stable layer can include doped tin oxide, which can have similar, but not as good, lattice matching with silver as zinc oxide.

Because of the promoted (111) crystal orientation of the reflective layer 154, which is caused by the promoted (002) crystal orientation of the seed layer 152, which, in turn, is caused by the thermal stable layer 150, the conductivity and emissivity of the reflective layer 154 is improved. As a result, a thinner reflective layer 154 may be formed that still provides sufficient reflective properties and visible light transmission. Additionally, the reduced thickness of the reflective layer 154 allows for less material to be used in each panel that is manufactured, thus improving manufacturing throughput and efficiency, increasing the usable life of the target (e.g., silver) used to form the reflective layer 154, and reducing overall manufacturing costs.

Further, the seed layer 152 and/or the thermally stable layer 150 can provide a barrier between the metal oxide layer 140 and the reflective layer 154 to reduce the likelihood of any reaction of the material of the reflective layer 154 and the oxygen in the lower metal oxide layer 140, especially during subsequent heating processes. As a result, the resistivity of the reflective layer 154 may be reduced, thus increasing performance of the reflective layer 154 by lowering the emissivity.

Formed on the reflective layer 154 is a barrier layer 156, which can protect the reflective layer 154 from being oxidized. For example, the barrier layer can be a diffusion barrier, stopping oxygen from diffusing into the silver layer from the upper oxide layer 160. The barrier layer 156 can include titanium, nickel or a combination of nickel and titanium.

Formed on the barrier layer 156 is an upper oxide layer 160, which can function as an antireflective film stack, including a single layer or multiple layers for different functional purposes. The antireflective layer 160 serves to reduce the reflection of visible light, selected based on transmittance, index of refraction, adherence, chemical durability, and thermal stability. In some embodiments, the antireflective layer 160 includes tin oxide, offering high thermal stability properties. The antireflective layer 160 can include titanium dioxide, silicon nitride, silicon dioxide, silicon oxynitride, niobium oxide, SiZrN, tin oxide, zinc oxide, or any other suitable dielectric material.

Formed on the antireflective layer 160 is an optical filler layer 170. The optical filler layer 170 can be used to provide a proper thickness to the low-e stack, for example, to provide an antireflective property. The optical filler layer preferably has high visible light transmittance. In some embodiments, the optical filler layer 170 is made of tin oxide and has a thickness of, for example, 100 Å. The optical filler layer may be used to tune the optical properties of the low-e panel 105.

For example, the thickness and refractive index of the optical filler layer may be used to increase the layer thickness to a multiple of the incoming light wavelengths, effectively reducing the light reflectance and improving the light transmittance.

Formed on the optical filler layer 170 is an upper protective layer 180. An upper protective layer 180 can be used for protecting the total film stack, for example, to protect the panel from physical or chemical abrasion. The upper protective layer 180 can be an exterior protective layer, such as silicon nitride, silicon oxynitride, titanium oxide, tin oxide, zinc oxide, niobium oxide, or SiZrN.

In some embodiments, adhesion layers can be used to provide adhesion between layers. The adhesion layers can be made of a metal alloy, such as nickel-titanium, and have a thickness of, for example, 30 Å.

It should be noted that depending on the materials used, some of the layers of the low-e stack 190 may have some materials in common. An example of such a stack may use a zinc-based material in the oxide dielectric layers 140 and 160. As a result, a relatively low number of different targets can be used for the formation of the low-e stack 190.

In some embodiments, the coating can include a double or triple layer stack, having multiple IR reflective layers. In some embodiments, the layers can be formed using a plasma enhanced, or reactive sputtering, in which a carrier gas (e.g., argon) is used to eject ions from a target, which then pass through a mixture of the carrier gas and a reactive gas (e.g., oxygen), or plasma, before being deposited.

Figure 2A:
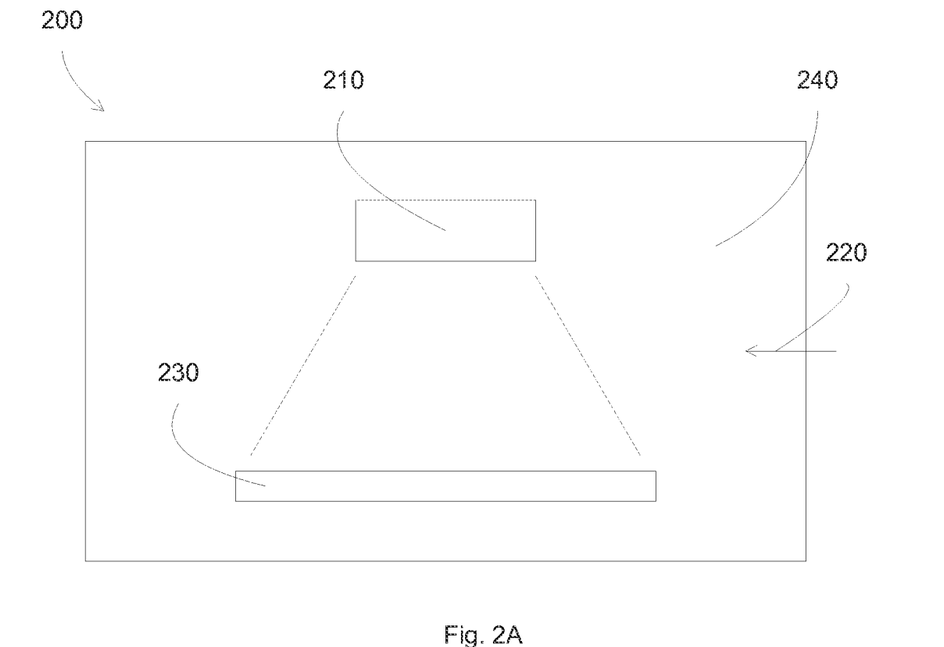
FIGS. 2A-2B illustrate exemplary physical vapor deposition (PVD) systems according to some embodiments.
Figure 2B:
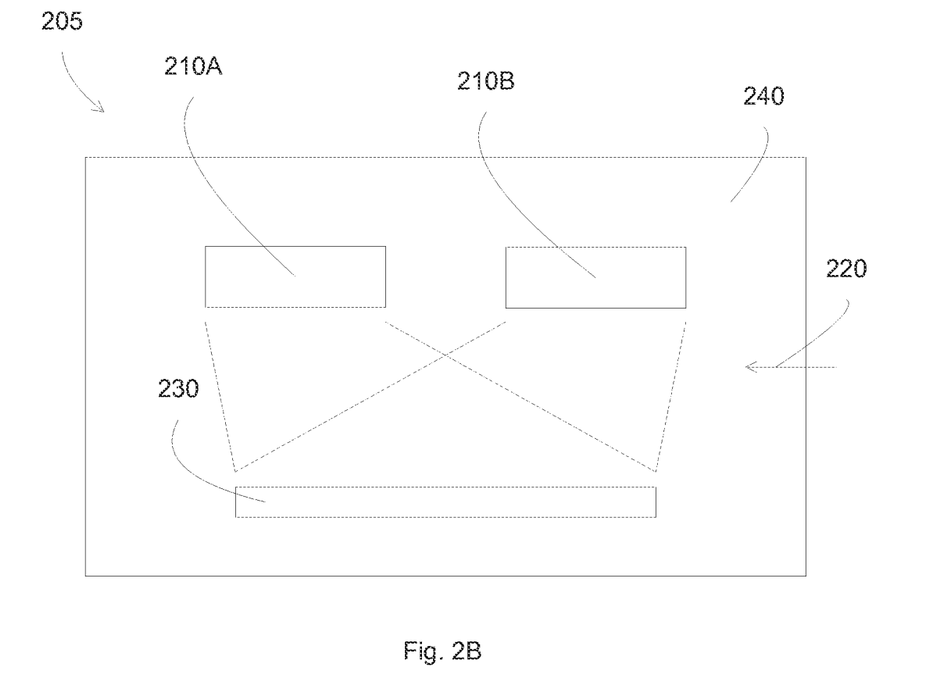

FIGS. 2A-2B illustrate exemplary physical vapor deposition (PVD) systems according to some embodiments. In FIG. 2A, a PVD system, also commonly called sputter system or sputter deposition system, 200 includes a housing that defines, or encloses, a processing chamber 240, a substrate 230, a target assembly 210, and reactive species delivered from an outside source 220. The substrate can be stationary, or in some manufacturing environments, the substrate may be in motion during the deposition processes. During deposition, the target is bombarded with argon ions, which releases sputtered particles toward the substrate 230. The sputter system 200 can perform blanket deposition on the substrate 230, forming a deposited layer that cover the whole substrate, e.g., the area of the substrate that can be reached by the sputtered particles generated from the target assembly 210.

In FIG. 2B, a sputter deposition chamber 205 includes two target assemblies 210A and 210B disposed in the processing chamber 240, containing reactive species delivered from an outside source 220. The target assemblies 210A and 210B can include the dopant and silver to deposit a doped silver layer on substrate 230. This configuration is exemplary, and other sputter system configurations can be used, such as a single target as above, including and alloy of dopant and silver.

The materials used in the target assembly 210 (FIG. 2A) may, for example, include Ag, Ti, Si, Pd, Cr, Ni, Zr, Mn, Fe, Ta, Pt, Zn, Sn, Mg, Al, La, Y, Sb, Sr, Bi, or any combination thereof (i.e., a single target may be made of an alloy of several metals). Additionally, the materials used in the targets may include oxygen, nitrogen, or a combination of oxygen and nitrogen in order to form the oxides, nitrides, and oxynitrides described above. Additionally, one target assembly 210 (e.g., FIG. 2A), or additional target assemblies may be used (e.g. FIG. 2B). As such, different combinations of targets may be used to form, for example, the dielectric layers described above. For example, in an embodiment in which the dielectric material is aluminum doped tin oxide, the aluminum, and the tin may be provided by separate aluminum, and tin targets, or they may be provided by a single aluminum-tin alloy target.

In another example, the target assembly 210 can include a silver target, and together with argon ions, sputter deposit a silver layer on substrate 230.

The sputter deposition system 200 can include other components, such as a substrate support for supporting the substrate. The substrate support can include a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply, for example, to provide a RF or dc bias to the substrate, or to provide a plasma environment in the process housing 240. The target assembly 210 can include an electrode which is connected to a power supply to generate a plasma in the process housing. The target assembly 210 is preferably oriented towards the substrate 230.

The sputter deposition system 200 can also include a power supply coupled to the target electrode. The power supply provides power to the electrodes, causing material to be, at least in some embodiments, sputtered from the target. During sputtering, inert gases, such as argon or krypton, may be introduced into the processing chamber 240 through the gas inlet 220. In embodiments in which reactive sputtering is used, reactive gases may also be introduced, such as oxygen and/or nitrogen, which interact with particles ejected from the targets to form oxides, nitrides, and/or oxynitrides on the substrate.

The sputter deposition system 200 can also include a control system (not shown) having, for example, a processor and a memory, which is in operable communication with the other components and configured to control the operation thereof in order to perform the methods described herein.

In some embodiments, the first seed layer can improve the crystallinity and (002) orientation of the zinc oxide or doped zinc oxide layer. The improvement of the zinc oxide or doped zinc oxide layer can in turn improve the (111) silver growing on top of the zinc oxide or doped zinc oxide layer, producing a silver layer with improved electrical conductivity. The present methods thus can maximize volume production, throughput, and efficiency of the manufacturing process used to form low emissivity panels.

Figure 3A:
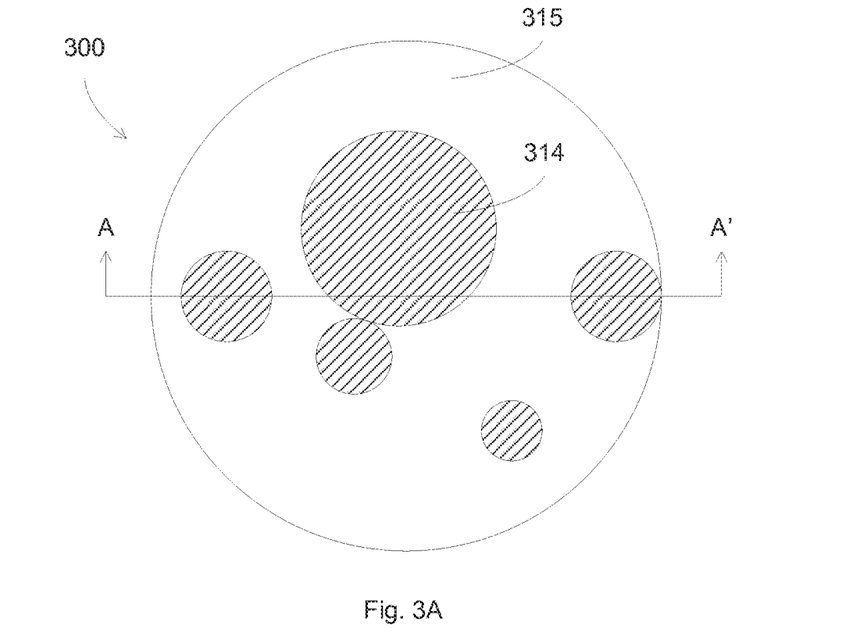
FIGS. 3A-3B illustrate an exemplary layer stack including a non-continuous seed layer according to some embodiments.
Figure 3B:
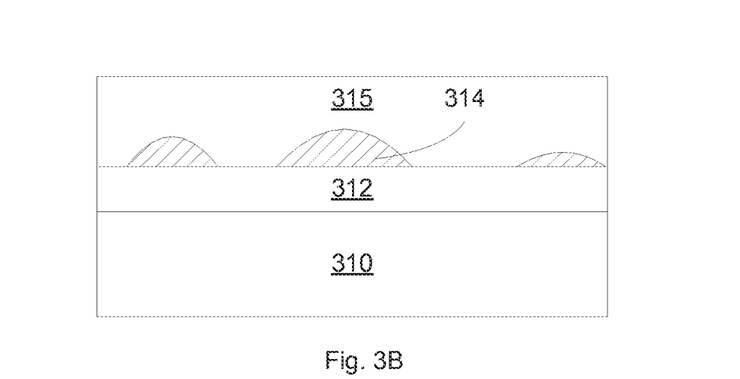

FIGS. 3A-3B illustrate an exemplary layer stack including a non-continuous seed layer according to some embodiments. FIG. 3A shows a top view, and FIG. 3B shows a cross section AA' of a same layer stack. A silver layer 315 is disposed on a seed layer 314 which includes zinc oxide. The seed layer 314 is disposed on a thermally stable layer 312, such as aluminum, magnesium, or bismuth doped tin oxide, which is disposed on a substrate 310 to form a coated transparent panel 300. In some embodiments, the thermally stable layer includes tin oxide doped with aluminum, magnesium, or bismuth.

The seed layer 314 can include a plurality of sections or portions, which are distributed across the lower thermally stable layer 312 such that some of the sections are laterally spaced apart from other layer sections across the lower thermal stable layer 312 and do not completely cover the lower thermally stable layer 312. Some of the sections can overlap, or be adjacent to each other. In some embodiments, the seed layer 314 and/or the seed layer sections may have a thickness of, for example, between about 0.2 nm and about 0.4 nm, and the separation between the seed layer sections may be the result of forming such a thin layer (i.e., such a thin layer may not form a continuous layer).

In some embodiments, the seed layer 314 with the individual sections may represent a state of a continuous interface layer during the formation thereof, before a desired thickness (e.g., 5 nm) is achieved. That is, the bottom layer sections may form during the initial deposition of the bottom layer, and may subsequent grow together to form a continuous interface layer.

In some embodiments, the methods can include in-situ formation of a ZnO seed layer on a thermally stable layer of aluminum, magnesium, or bismuth doped tin oxide layer; a silver layer on a seed oxide; or a silver layer on a seed oxide on a thermal stable layer, without exposure to atmosphere. By controlling the surface of the seed layer or the thermally stable layer, for example, to reduce any possible surface contamination, the quality of the silver layer can be further promoted and not impeded by any adhered particulates.

For example, a layer of ZnO seed can be deposited on a substrate, such as on a thermally stable layer, in a deposition chamber. After completing the deposition, the chamber is purged and a layer of silver can be deposited on the ZnO seed layer in the same chamber, without exposing the substrate to outside ambient.

In some embodiments, the present invention discloses sputter systems, and methods to operate the sputter systems, for making coated panels, including a doped target together with a silver target to deposit a first layer of doped silver under a layer of silver on a transparent substrate. In some embodiments, the present invention discloses an in-line deposition system, including a transport mechanism for moving substrates between deposition stations.

Figure 4:
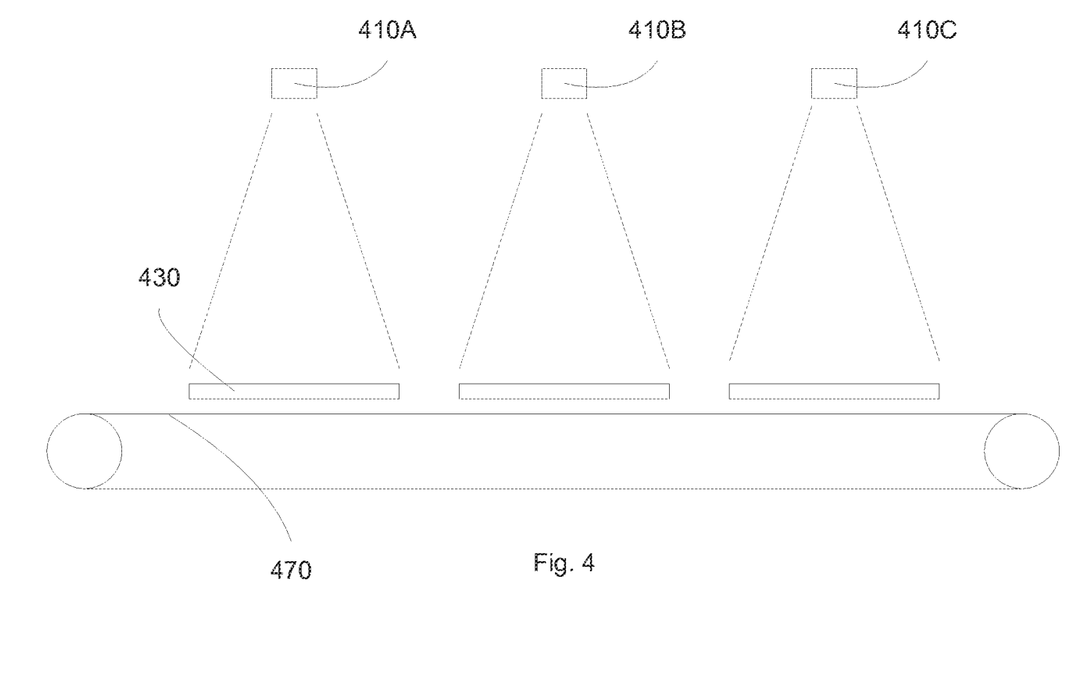
FIG. 4 illustrates an exemplary in-line deposition system according to some embodiments.

FIG. 4 illustrates an exemplary in-line deposition system according to some embodiments. A transport mechanism 470, such as a conveyor belt or a plurality of rollers, can transfer substrate 430 between different sputter deposition stations. For example, the substrate can be positioned at station #1, including a target assembly 410A, then transferred to station #2, including target assembly 410B, and then transferred to station #3, including target assembly 410C. Station #1 can be configured to deposit a thermally stable layer, for example, including a tin oxide doped with aluminum, magnesium, or bismuth. Station #2 can be configured to deposited a zinc oxide layer, which can include (002) crystal orientation. Station #3 can be configured to deposit a silver layer, which can include (111) crystal orientation. As shown, the target assembly 410A includes tin alloy material, e.g., a mixture of tin and a dopant (e.g., aluminum, magnesium, or bismuth) material. Other configurations can be included, for example, station #2 can include two target assemblies for co-sputtering, such as a target assembly including a dopant material and a target assembly including tin or tin oxide.

A first layer can be deposited in station #1, for example, an aluminum, magnesium, or bismuth doped tin oxide layer. The substrate is moved to station #2, where a zinc oxide layer can be deposited. The zinc oxide layer can have (002) crystal orientation. The (002) crystal orientation of the deposited zinc oxide layer can serve as a template for the subsequently deposited silver layer in station #3. The substrate is then transferred to station #3 to deposit a silver layer over the zinc oxide layer. The (111) crystal orientation of the silver layer can be improved by the (002) orientation of the zinc oxide seed layer.

In some embodiments, the thin zinc oxide seed layer can be used due to the thermally stable underlayer. The thin zinc oxide seed layer can present less thermal instability issues, and the thermally stable layer can provide improved thermal stability, thus the bi-layer of seed layer on thermally stable layer can offer similar low emissivity property with better thermal stability property.

In some embodiments, the present invention discloses a high transmittance, low emissivity coated article, e.g., a panel, including a transparent substrate (such as a glass or plastic substrate) having a bi-layer seed structure including a zinc oxide layer disposed on a tin oxide layer doped with aluminum, magnesium, or bismuth. The tin oxide layer can be doped with at least 15% by weight of aluminum, magnesium or bismuth. The aluminum, magnesium or bismuth composition can be less than 70% by weight, such as less than 35% by weight. Al—Sn-Oxide, Mg—Sn-Oxide, or Bi—Sn-Oxide can improve the thermal characteristics of such a low emissive coating, for example, providing minimal structural or color changes upon high temperature processing. For example, color or optical property of the bi-layer seed structure can exhibit smaller changes after a high temperature process as compared to single layer zinc oxide seed layer.

The coated panels according to some embodiments of the invention can be heat treated (e.g., thermally tempered, heat bent and/or heat strengthened), and still retain similar structure, optical and visual appearance as the non heat treated panels. The high temperature process, e.g., a heat treatment, can include a high temperature anneal at 500 C or higher.

In some embodiments, improved coated transparent panels are provided that can have acceptable visible light transmission and IR reflection, along with thermally stable characteristics after high temperature processing. The methods of producing the improved, coated, transparent panels can include specific layers in a coating stack. One layer includes tin oxide having a dopant such as aluminum, magnesium or bismuth as a underlayer for a zinc oxide seed layer. In some embodiments, the coated transparent panels have a low haze value, before and after heat treatments. Haze can be due to the scattering of incident light, caused by surface roughness, for example, large crystalline size, different crystalline sizes or imbedded particles. By controlling the morphological structure, the panels incorporating the bi-layer seed structure can have reduced haze values.

In some embodiments, multiple layer stacks and/or multiple low emissivity layers can be utilized. In addition, the present invention controls the thermal properties of the layer stack so that the optical and structural properties of the heat treated and non heat treated panels are similar. In some embodiments, other coatings are selected to have a high level of visible light transmittance, before and after a heat treatment. In some embodiments, the other layers can be any of the layers well known in the art.

Figure 5:
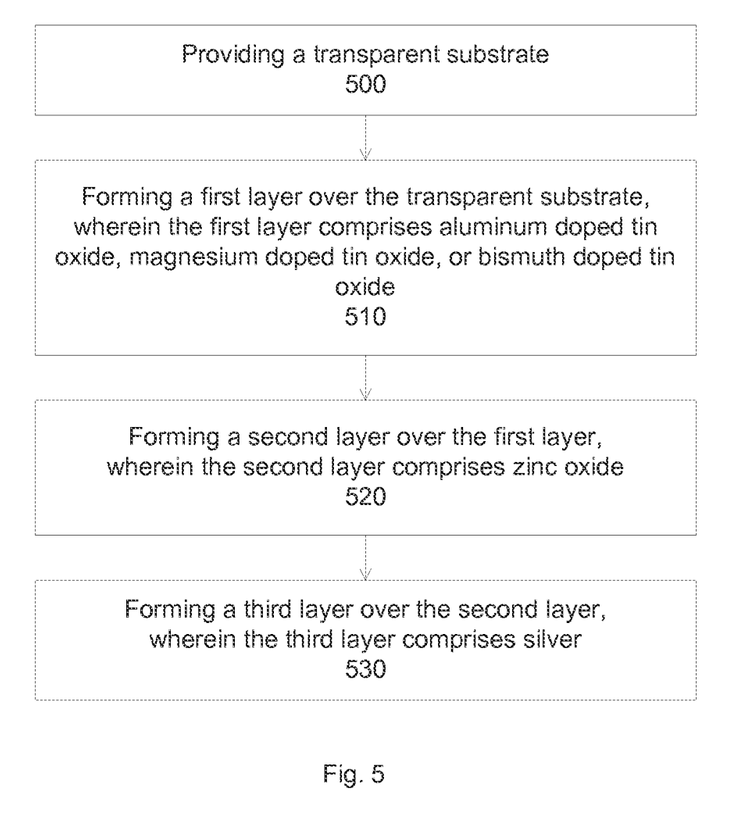
FIG. 5 illustrates an exemplary flow chart for seed layer deposition according to some embodiments.

FIG. 5 illustrates an exemplary flow chart for seed layer deposition according to some embodiments. In operation 500, a transparent substrate is provided. In operation 510, a first layer is formed on the transparent substrate. In some embodiments, the first layer includes a doped tin oxide. The dopant can include aluminum, magnesium, or bismuth.

In some embodiments, the first layer can have a thickness between 6 and 50 nm, such as between 8 and 50 nm or between 8 and 30 nm. The first layer can include a doping concentration of between 3 and 70 wt %, such as between 3 and 35 wt %, or between 15 and 35 wt %.

In operation 520, a second layer is formed on the first layer. In some embodiments, the second layer includes zinc oxide, e.g., a zinc oxide containing layer such as a zinc oxide layer or a doped zinc oxide layer. Since the second layer is deposited on the first layer, the crystal orientation of the first layer can influence the crystal orientation of the second layer, thus the first layer can enable a zinc oxide layer having improved (002) crystal orientation, as compared to a zinc oxide layer without the first layer.

In some embodiments, the second layer is formed on the first layer without being exposed to the ambient environment, e.g., ambient air. The control of the sequence deposition of the first and second layers can enhance the templating effect of the first layer on the second layer, improving the crystallinity of the second layer.

In some embodiments, the second layer can be less than or equal to about 12 nm or less than or equal about 8 nm.

In some embodiments, the first layer can be thin, for example, between about 2 nm and about 4 nm. The first layer can be continuous across the substrate surface. In some embodiments, the first layer can form separated or adjacent sections on the substrate surface. For example, the thickness of the sections can be between about 0.2 nm to about 0.4 nm.

In operation 530, a third layer is deposited on the second layer. In some embodiments, the third layer can be operable as an infrared reflective layer. In some embodiments, the third layer includes silver. Since the third layer is deposited on the second layer, the crystal orientation of the second layer can influence the crystal orientation of the third layer, thus the second zinc oxide layer having improved (002) crystal orientation can enable a silver layer having improved (111) crystal orientation, as compared to a silver layer deposited on a zinc oxide layer with less (002) crystal orientation.

In some embodiments, the thickness of the third layer can be between 6 and 20 nm, such as less than or equal to about 12 nm or less than or equal about 8 nm.

In some embodiments, an annealing step can be performed in an oxygen-containing ambient, for example, after forming the second layer. The annealing step can partially oxidize the first layer, forming an at least partially oxidized first layer.

In some embodiments, a photovoltaic device, a LED (light emitting diode) device, a LCD (liquid crystal display) structure, or an electrochromic layer is formed on the substrate having the layer structure.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A low emissivity panel, comprising:
    a transparent substrate;
    a first layer formed above the transparent substrate, wherein the first layer consists of bismuth doped tin oxide with a doping concentration between 3 and 35 wt %; and
    a second layer formed above the transparent substrate and first layer, wherein the second layer is operable as an infrared reflective layer.

2. The low emissivity panel of claim 1 further comprising a third layer formed between the first layer and the second layer, and wherein the third layer comprises zinc oxide and is formed directly on the first layer, and the second layer is formed directly on the third layer.

3. The low emissivity panel of claim 1 wherein the first layer has a thickness between 6 nm and 50 nm, and the second layer has a thickness of less than about 8 nm.

4. The low emissivity panel of claim 3 wherein the second layer comprises silver.

5. A low emissivity panel, comprising:
    a transparent substrate;
    a lower protective layer formed above the transparent substrate, wherein the lower protective layer comprises a nitride material;
    a lower oxide layer formed above the lower protective layer, wherein the lower oxide layer comprises a metal oxide or a metal alloy oxide;
    a thermal stability layer formed above the lower oxide layer, wherein the thermal stability layer consists of bismuth doped tin oxide with a doping concentration between 3 and 35 wt %;
    a seed layer formed directly on the thermal stability layer, wherein the seed layer comprises zinc oxide having a (002) crystallographic orientation;
    a reflective layer formed directly on the seed layer, wherein the reflective layer comprises silver having a (111) crystallographic orientation; and
    a barrier layer formed above the reflective layer, wherein the barrier layer comprises at least one of titanium, nickel, or a combination thereof.

6. The low emissivity panel of claim 5 wherein the thermal stability layer has a thickness between 6 nm and 50 nm.

7. The low emissivity panel of claim 6 wherein the seed layer has a thickness of less than about 8 nm.

8. The low emissivity panel of claim 5 further comprising an upper oxide layer formed above the barrier layer, wherein the upper oxide layer comprises at least one of titanium dioxide, silicon nitride, silicon dioxide, silicon oxynitride, niobium oxide, silicon zirconium nitride, tin oxide, zinc oxide, or a combination thereof.

9. The low emissivity panel of claim 8 further comprising an optical filler layer formed above the upper oxide layer, wherein the optical filler layer comprises tin oxide.

10. The low emissivity panel of claim 9 further comprising an upper protective layer formed above the optical filler layer, wherein the upper protective layer comprises at least one of silicon nitride, silicon oxynitride, titanium oxide, tin oxide, zinc oxide, niobium oxide, silicon zirconium nitride, or a combination thereof.

* * * * *